United States Patent
Yializis

[11] Patent Number: 6,066,826
[45] Date of Patent: May 23, 2000

[54] APPARATUS FOR PLASMA TREATMENT OF MOVING WEBS

[76] Inventor: Angelo Yializis, 11060 N. Poinsettia Dr., Tucson, Ariz. 85737

[21] Appl. No.: 09/042,511

[22] Filed: Mar. 16, 1998

[51] Int. Cl.[7] ................................................. B23K 9/00
[52] U.S. Cl. .................................... 219/121.52; 428/65.3
[58] Field of Search ........................... 219/121.52, 123; 428/141, 65.3; 204/169, 192 R, 298.31, 298.11, 192.12, 298.24; 427/28, 577; 118/723 E, 718

[56] References Cited

U.S. PATENT DOCUMENTS

| | | | |
|---|---|---|---|
| 2,393,199 | 1/1946 | Somerville | 219/123 |
| 3,884,787 | 5/1975 | Kuehnle | 204/192.12 |
| 4,013,539 | 3/1977 | Kuehnle | 204/298.24 |
| 4,278,528 | 7/1981 | Kuehnle et al. | 204/298.11 |
| 4,434,038 | 2/1984 | Morrison, Jr. | 204/192 R |
| 4,462,333 | 7/1984 | Nath et al. | 118/723 E |
| 4,479,455 | 10/1984 | Doehler et al. | 118/718 |
| 4,780,354 | 10/1988 | Nakayama et al. | 428/141 |
| 5,113,790 | 5/1992 | Geisler et al. | 204/298.31 |
| 5,399,254 | 3/1995 | Geisler et al. | 204/298.31 |
| 5,464,667 | 11/1995 | Kohler et al. | 427/577 |
| 5,481,084 | 1/1996 | Patrick et al. | 219/123 |
| 5,508,492 | 4/1996 | Pajerski et al. | 219/123 |
| 5,536,549 | 7/1996 | Nelson et al. | 428/65.3 |

*Primary Examiner*—Teresa Walberg
*Assistant Examiner*—Quang Van

[57] ABSTRACT

Apparatus and process for plasma treatment of moving webs, or films, are disclosed. The apparatus includes magnets and multiple hollow cathodes, which, in the presence of a plasma, magnetically focuses and thereby intensifies the plasma to one side of the film surface. The moving web is positioned either between the hollow cathodes and the magnets or in front of the hollow cathodes and the magnets. The plasma treatment functionalizes the film surface.

5 Claims, 3 Drawing Sheets

APPARATUS FOR PLASMA TREATMENT OF MOVING WEBS

TECHNICAL FIELD

The present invention is directed to a plasma treating apparatus, for efficient treatment of flexible moving webs, in which the treatment is performed at atmospheric and sub atmospheric pressures of air or other gas mixtures. High speed plasma treatment is accomplished by a unique combination of magnetic and hollow cathode effects to enhance the gas ionization and focus and direct the plasma energy onto the surface of the moving web.

BACKGROUND ART

Plasma treatment is a commonly used process for cleaning, etching, and in general chemically functionalizing a surface. Plasma treatment is used in a great variety of applications, including semiconductor fabrication, treatment of metal foils, treatment of polymer articles, and, in general, treatment of surfaces that need to be cleaned and functionalized for improved adhesion and chemical compatibility with other materials.

The present invention addresses the use of plasma treatment for webs moving at high speeds. Modem manufacturing requires materials such as polymer films, fabrics, paper, and metal sheeting to be processed at speeds of the order of hundreds to several thousand feet per minute. More specifically, polymer films such as polypropylene and polyester are manufactured at speeds in the neighborhood of 1 to 5 m/sec. Such films are also metallized for use in food, electronic, capacitor, and packaging applications at speeds as high as 20 m/sec.

Polymer films are usually functionalized during their manufacture using techniques such as corona treatment (see, e.g., C. M. Chan, *Polymer Surface Modification and Characterization*, Hanser/Gardner Publications, Inc., Ch. 6, pp. 225–279, Cincinnati (1994); D. M. Brewis, "Factors Affecting the Metallization of Plastics", *Electrochemical Society Proceedings*, Vol. 97-30, Abstract No. 1652, p. 1914 (1997); A. Ahlbrandt, U.S. Pat. No. 4,774,061, issued Sep. 27, 1988; and S. R. Sabreen, U.S. Pat. No. 5,051,586, issued Sep. 24, 1991) and/or flame treatment (see, e.g., C. M. Chan, supra; W. Osthoff, U.S. Pat. No. 4,627,135, issued Dec. 9, 1986; and W. G. Wise, U.S. Pat. No. 4,610,627, issued Sep. 9, 1986). Such treatment is used to generate polar functional groups on the film surface, which prepares the films for subsequent processes such as printing, coating, laminating and metallizing.

Prior to the metallization process, polymer films— regardless of pretreatment—are plasma-treated in the vacuum chamber to further clean the surface and promote adhesion of the metal to the polymer surface (see, e.g., C. M. Chan, supra; G. L Robertson, supra; Q. T. Le et al., "Oxygen and carbon dioxide plasma modifications of PET surfaces. XPS study on adhesion to aluminum", *Electrochemical Society Proceedings*, Vol. 97-30, Abstract No. 1660, p. 1922 (1997); and A. Nihlstrand et al., "Plasma Treatment of Polyolefins: Influence of Plasma Parameters and Material Composition on Paint Adhesion", *Electrochemical Society Proceedings*, Vol. 97-30, Abstract No. 1662, p. 1924 (1997); and H. Uchiyama et al, U.S. Pat. No. 5,543,017, issued Aug. 6, 1996).

Plasma treatment in the past was performed almost exclusively in a vacuum chamber. More recently, there have been several attempts to extend the plasma treatment process to atmospheric pressure, which eliminates costly pumping systems and allows the process to be performed in-line with other operations (see, e.g., T. Tanisaki et al, U.S. Pat. No. 5,391,855, issued Feb. 21, 1995; and A. Yializis et al, "Superior Polymer Webs via in situ Surface Functionalization", *Society of Vacuum Coaters*, 39th Annual Technical Conference Proceedings, (1996)).

Effective treatment varies from one application to another and it is usually measured in exposure at a given energy level per unit area, or $J/cm^2$. In batch processes, articles immersed in a plasma environment can easily be treated at a desired level of treatment by varying exposure time. Additional exposure of a few seconds, even minutes, is not out of line with other operations such as fixturing of the articles and pumping. In applications that require treatment of moving webs, higher level of treatment usually dictates higher plasma power and/or long plasma reactors, which can make plasma treatment economically prohibitive. This is especially true for modem aluminum metallizing operations, which are performed at speeds in the range of 10 to 20 m/sec. The object of the present invention is the development of an efficient highly energetic plasma reactor for treating webs moving at high speed.

DISCLOSURE OF INVENTION

The present invention utilizes several known plasma-enhancing effects combined in a unique design, to produce very high intensity plasmas that are effectively used to treat fast moving webs. Magnetic enhancement of plasmas is possible because at a given pressure and electrical power, the curling motion of the electrons, dictated by the force on the moving electron $$F=e\cdot \bar{v} \times \bar{B}$$

(where e is the electron charge and $\bar{v}$ the electron velocity perpendicular to the magnetic field $\bar{B}$) prolongs the presence of the electrons, thus increasing the probability for collisions and higher rate of ionization. Electron trapping in a hollow cathode (a negatively charged electrode) is also known to increase the level of ionization. An electron entering a region that is surrounded by a negatively charged conductor will be repelled multiple times before escaping into a ground or a more positively charged surface. In the process, the number of collisions and the rate of ionization is increased, resulting in a more intense plasma in the hollow cathode region. Another key consideration is the applied electric field. High Radio Frequency (RF) and microwave voltages are known to enhance the ionization at a given gas pressure. Direct Voltage (DC) plasmas, although they have lower volume ionization, create high energy ions that can dislodge other ions from a substrate surface. DC plasmas are used to sputter metals from metal targets onto substrates, many times with the aid of magnetic fields, in a process that is known as DC magnetron sputtering. In the present invention, it was found that the highly energetic DC plasmas are not acceptable because insulating webs charge-up, repelling charged ions and thus minimizing treatment. Instead of the commonly used high frequency RF (13.5 MHz), a much lower frequency region of 20 to 40 KHz was chosen, which allows continuous treatment at speeds of 20 m/sec, eliminates charging problems, and maximizes the energy of the bombarding ions.

The present invention relates to a process of functionalizing a film surface in a vacuum, and an apparatus described below for the process. The vacuum can range from atmospheric pressure, 760 Torr, to vacuum, $10^{-3}$ Torr. The apparatus of this invention includes a rectangular hollow cathode and magnets, either of the permanent type or the electric type. The film is inserted through a slit on one side of the plasma treater and exits out another slit on the other side. Gas is flowed into the hollow cathode for a stable production of electrons and ionized gas species, and a plasma is ignited with a high voltage power supply. Commonly-used gases are nitrogen mixed with noble gases such as helium, neon, argon, or xenon. Noble gases posses higher metastable energies which leads to a more stable plasma and a higher ionization rate. Additionally, reactive gases such as oxygen, carbon dioxide, or ammonia can be added for specific functionalization of the polymer surface, such as is disclosed by F. Arefi-Khonsari et al, "Study of Plasma-Treated Polymers and the Stability of the Surface Properties", *Electrochemical Society Proceedings*, Vol. 97-30, Abstract No. 1659, p. 1921 (1997). The film passes directly under the magnets in the plasma treater which magnetically focuses and thereby intensifies the plasma to one side of the film surface. The functionalization of the film is limited to only one side of the film because the gap width between the lid and the other side of the film is not sufficient to create a plasma. The film is moved through the plasma treater and is functionalized as the film passes over the plasma. The process and apparatus allow for high speed treatment of film in a reel-to-reel system at low cost.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Figure 1A:
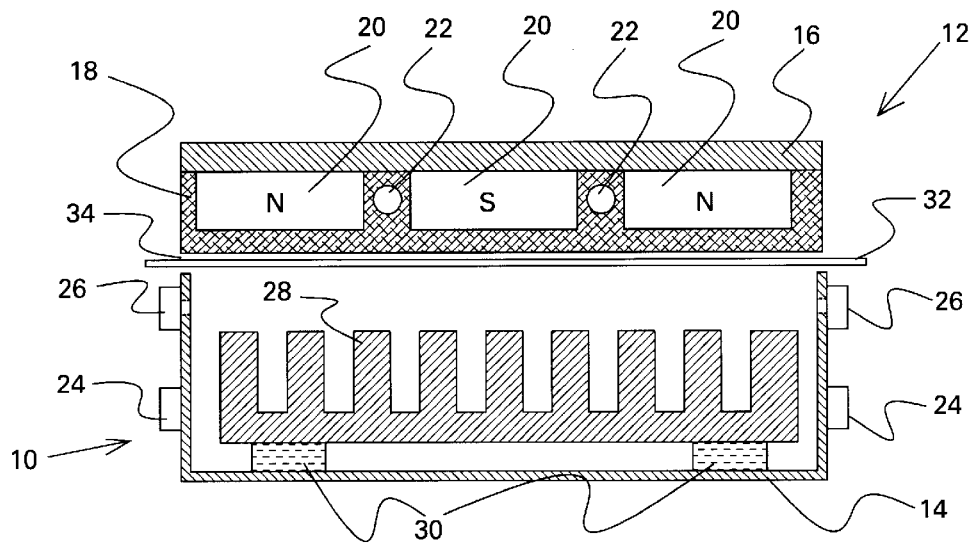
FIGS. 1 and 2 are sectional views of the plasma treater either for unsupported polymer film webs (FIGS. 1A and 1B) or for supported webs (FIG. 2A and 2B)

Turning now to FIG. 1A, the plasma treater 10 comprises a rigid lid assembly 12 and a rigid housing 14. The lid assembly 12 consists of a top lid plate 16 made from magnetic steel attached to a bottom lid plate 18 made from non-magnetic material. The magnetic lid 16 shorts the magnetic fields of magnets 20 (three such magnets are shown, contained in the bottom lid 18) and is used to return the magnetic field lines. In addition to the magnets 20, the bottom lid plate 18 contains cooling pipes 22 for cooling the bottom lid plate. The housing 14 also includes cooling pipes 24 for cooling the housing. The housing 14 further includes a gas inlet manifold pipe 26. Through the gas inlet manifold pipe 26 the plasma treatment gas can be introduced into the chamber. Non-magnetic hollow cathodes 28 are attached to the inside of the housing 14 and insulated from the latter by ceramic insulators 30. The cathode 28 is connected to a power supply (not shown) which can deliver electric energy in the kW range and with frequency that can vary from 0 Hz (DC—direct current) to 13.5 MHz. The film, or moving web, 32 to be treated is inserted through a slit 34 between the lid 18 and the housing 14. The web 32 is positioned close to lid 18 so that no plasma can exist between the web and the lid. This prevents plasma treatment of the backside of the web 32.

Figure 1B:
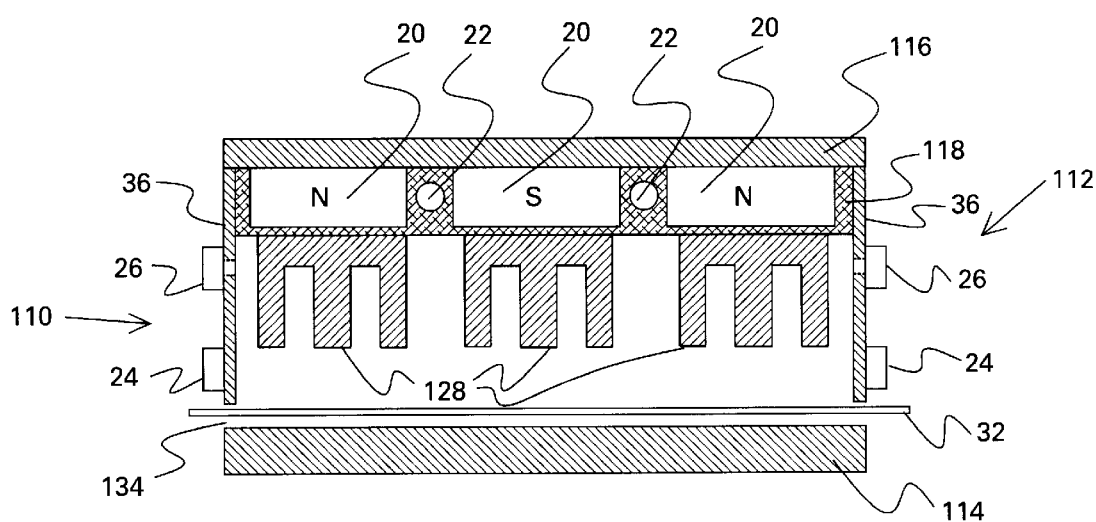

A second reactor design 110, shown in FIG. 1B, has two rigid side plates 36 attached to the lid assembly 112. The lid assembly 112 consists of a top lid plate 116 made from magnetic steel attached to a bottom lid plate 118 made from non-magnetic material. The bottom lid plate 118 contains magnets 20 and cooling pipes 22. The side plates 36 contain cooling pipes 24. The side plates 36 also contain a gas inlet manifold pipe 26, through which the plasma treatment gas can be introduced into the chamber. Hollow cathodes 128 made from magnetic steel, are attached to the bottom lid 118. The cathodes 128 are connected to a power supply (not shown), which delivers electric energy in the kW range and with a frequency the can vary cycles from 0 Hz to 13.5 MHz. The web 32 is inserted through a slit 134 between side plates 36 and the bottom plate 114, which replaces the rigid housing 14 of FIG. 1A. In this arrangement, the magnetic field is extended through the magnetic steel cathodes 128 into the space in front of the cathodes. The plasma enhancement in front of the cathodes 128 is compounded by the hollow cathode effect and the presence of the magnetic field, leading to a highly efficient treatment of the web 32.

Figure 2A:
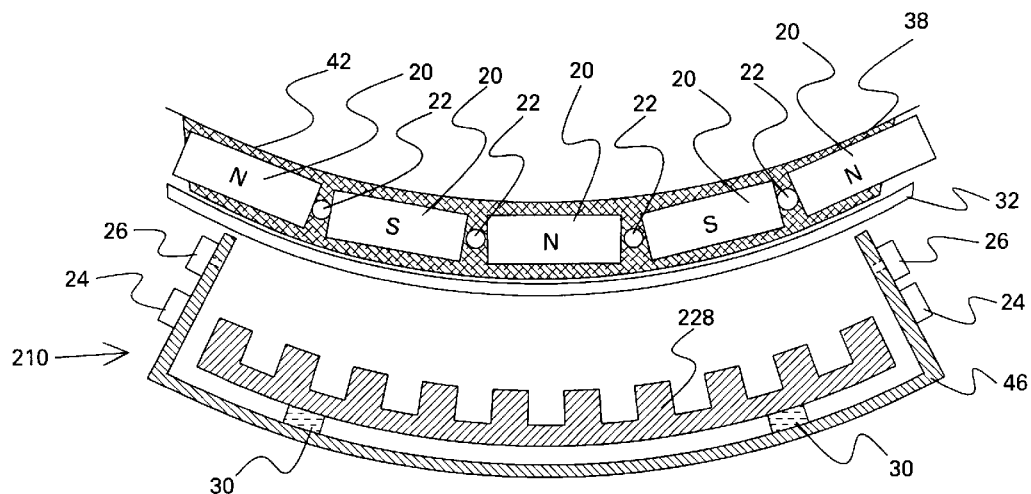
Figure 2B:
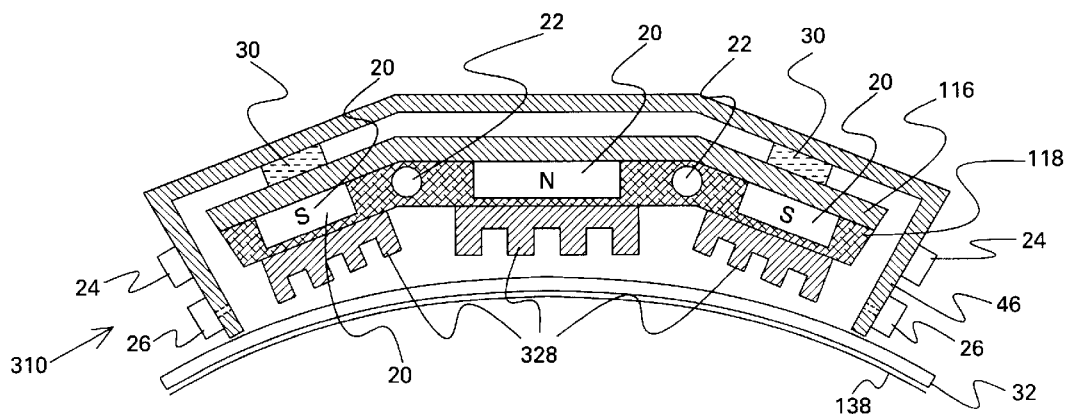

FIGS. 2A and 2B show plasma reactors 210 and 310, respectively, which correspond to plasma reactors 10 and 110 of FIGS. 1A and 1B, respectively, for treating webs 32 that are supported by a roll during their treatment. In this case, as shown in FIG. 2A, the lid assembly 12 is replaced with a roller assembly 38 comprising a magnetic material, which is covered with a non-magnetic layer 42 and in which magnets 20 are embedded. The film 32 is transported with the roller assembly 38 past the hollow cathodes 228, which are supported in stationary housing 46. The shape of the housing 46 and the cathode 228 is matched with the outer diameter of the roller assembly 38. The housing 46 also includes cooling pipes 24 and gas inlet manifold pipe 26, as described above.

In FIG. 2B, the flat bottom plate 114 of FIG. 1B is substituted with a roll 138 made from magnetic material, which transports the film 32 through the plasma treater 310. As in FIG. 1B, the cathode 328 is placed in front of the magnets 20.

It should be noted that in the plasma treaters described above, non-magnetic material can be stainless steel metal and magnetic material can be a conventional magnetic steel or a magnetic stainless steel. The magnets can be made of wound coil electromagnets or various metal/ceramic/rare earth formulations that result in strong permanent magnets.

In addition to improving the surface characteristics, such as promoting adhesion of metal films, increasing corrosion resistance of deposited metal films, reduction of oxygen transmission, etc., of the substrate 32, the apparatus of the present invention is useful in depositing a polymer coating from an organic-based plasma gas onto the substrate.

EXAMPLES

Example 1

Figure 3:
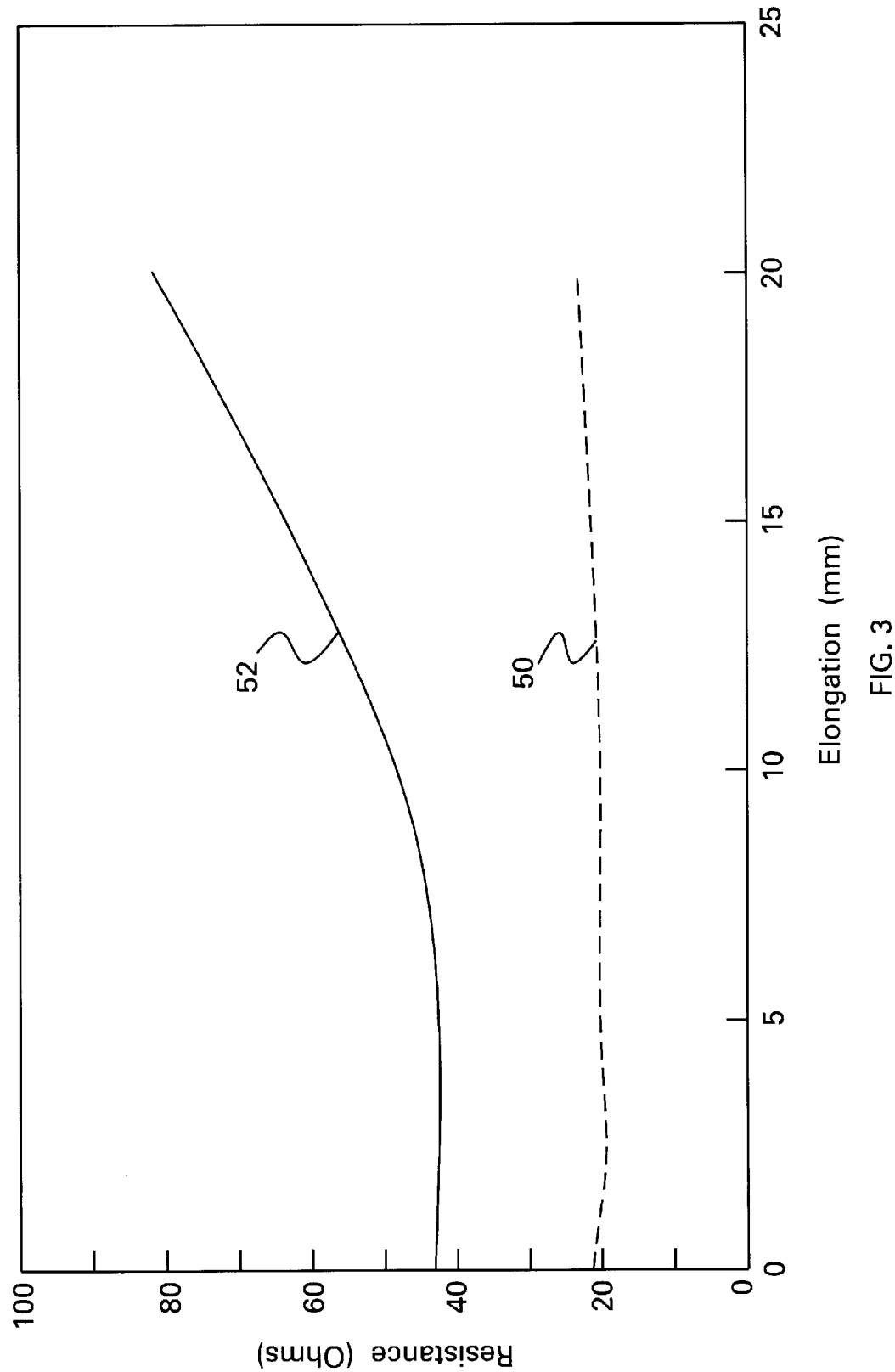
FIG. 3, on coordinates of resistance (in ohms) and elongation (in mm), is a plot of resistive elongation tests of plasma-treated and untreated metallized films for two different films.

Resistive elongation tests (RET) measures the resistance of a metallized strip of film as a function of the film's elongation. As the film stretches, cracking and microcracking of the metal on the film causes the resistance to increase. This cracking of the metal layer can be attributed to poor adhesion of the metal to the film surface (C. M. Chan, supra). FIG. 3 shows RET results for two metallized strips of polypropylene film: plasma-treated, then metal coated (Curve 50) and metal coated only (Curve 52). These results are typical of a plasma produced using the plasma reactor of FIG. 1A, 90% $N_2$ and 10% Ar gas mixture, and power densities in the range of 0.008 to 0.1 $J/cm^2$, using a voltage frequency of 40 KHz. FIG. 3 shows that the metallized strip of film that was plasma-treated first (Curve 50) has a smaller increase in resistance as a function of elongation as compared to the metallized strip of film not plasma-treated (Curve 52). The lower resistance suggests that the plasma-treated metallized film underwent less microcracking than the metallized only films. This is usually the result of a superior metallized layer that has better adhesion to the substrate.

Example 2

One application of metallized film is to reduce the oxygen and moisture vapor transmission rates. Experimental data (Tables I and II) show that metallized polypropylene films that were first plasma treated have significantly lower oxygen and moisture vapor transmission rates than metallized film not plasma-treated. The reactor of FIG. 1A was used and plasma conditions for these films were 90% $N_2$ and 10% Ar plasma gas mixture, and 0.08 $J/cm^2$, using a voltage frequency of 40 KHz.

TABLE I

Oxygen Transmission Rates of Plasma-Treated and Non-Treated Metallized Polypropylene Films.

| | Oxygen Transmission Rate ($cm^3$/100 $in^2$/day) | | |
|---|---|---|---|
| | Metallized Only | Plasma Treated and Metallized | Improvement by Plasma Treatment |
| NORMALLY NON-METALLIZABLE FILMS | | | |
| Film 1 | 105.4 | 34.54 | 305% |
| Film 2 | 52.5 | 10.96 | 477% |
| Film 3 | 22.42 | 1.92 | 1166% |
| METALLIZABLE FILMS | | | |
| Film 4 | 2.58 | 0.99 | 260% |
| Film 5 | 1.96 | 0.66 | 297% |

TABLE II

Moisture Vapor Transmission Rates of Plasma-Treated and Non-Treated Polypropylene Metallized Films.

| | Moisture Vapor Transmission Rate ($cm^3$/100 $in^2$/day) | | |
|---|---|---|---|
| METALLIZABLE FILMS | Metallized Only | Plasma Treated and Metallized | Improvement by Plasma Treatment |
| Film 1 | 0.021 | 0.0112 | 187% |
| Film 2 | 0.0315 | 0.0197 | 160% |

Example 3

Polypropylene film were metallized with aluminum metal, with and without plasma treatment. The plasma reactor of FIG. 1A, 90% $N_2$ and 10% Ar gas mixture, and power density of 0.1 $J/cm^2$, using a voltage frequency of 40 KHz, were employed.

Both plasma-treated and non-treated metallized films were tested using X-Ray Diffraction (XRD) analysis. The XRD results show a significant difference in the aluminum crystal size of plasma-treated versus untreated films. The plasma-treated aluminized films have a smaller aluminum crystal structure than that of an untreated aluminized film. Also, the optical density of the plasma pretreated film is 5 to 50% higher than that of the non-treated film. The difference in optical density is higher for films that have poor or no pretreatment. Corrosion tests in conditions of 85% RH (relative humidity) and 85° C. and over periods as long as 200 hours show that the plasma-treated films corrode significantly less than the non-treated films.

Example 4

Plasma treatment has a direct effect on the roughness of a film's surface. Polypropylene and polyvinyledene difluoride (PVDF), when treated in a plasma of a gas mixture composed of 94% $CF_4$ and 6% $O_2$ and in the reactor of FIG. 1B, showed that the surface roughness of the films increased. The same results were observed when the same films were treated in an atmosphere of 90% $N_2$ and 10% Ar plasma. The degree of roughness varied with plasma power and it increased as the power was raised from 0.01 to 0.5 $J/cm^2$. This experiment was repeated with several voltage frequencies, including 60 Hz, 20 KHz, 40 KHz, 100 KHz, 300 KHz, and 13.5 MHz. This roughness is correlated with superior adhesion of a coating deposited on the treated surface.

Example 5

The reactor of FIG. 1B was used in a plasma of 50% $N_2$ and 50% Ar and a plasma density of 8.0 $J/cm^2$ to treat a new polyimide film prior to deposition of a copper metal layer. Voltage frequencies of 0 Hz (DC voltage) and 40 KHz were used for this work, and were both equally effective as long as the plasma density of about 8 $J/cm^2$ was used. This very high plasma energy was necessary to assure very high adhesion of the copper layer. The copper-coated polyimide was used to produce flexible printed circuits, which required dipping of the copper coated film into molten solder. It was found that if a highly focused high power density plasma was not used, the copper layer would bubble-up and come off in the solder bath.

Example 6

The reactor of FIG. 1A was used to polymerize a thin polymeric coating on a copper foil. Copper foil with a thickness of 0.002 inch had to be coated with tin metal. In order to promote adhesion of the tin to the copper, and also provide some physical isolation of the tin coating, a thin layer of silicon-based polymer was deposited in-line with the tin deposition, using a plasma of a siloxane organic monomer and argon gas. The gas mix was approximately 20% argon and 80% siloxane monomer gas. The plasma density was 2.0 $J/cm^2$, at a voltage frequency of 40 KHz. The siloxane-based polymer provided excellent adhesion to the tin.

Thus, there has been disclosed an apparatus for the plasma treatment of moving webs and process therefor. It will be readily apparent to those skilled in this art that various changes and modifications of an obvious nature may be made, and all such changes and modifications are considered to fall within the scope of the present invention, as defined by the appended claims.

What is claimed is:

1. Apparatus for treatment of a moving web by a plasma, said apparatus including:
   (a) at least one magnet for generating a magnetic field;
   (b) at least one hollow cathode for generating said plasma; and
   (c) means for passing said moving web in proximity to said at least one magnet and said at least one hollow cathode so as to expose one side of said moving web to said plasma, wherein said least one magnet and said at least one hollow cathode are located on opposite sides of said means for passing said moving web, whereby said magnetic field intensifies said plasma.

2. The apparatus of claim 1 wherein said hollow cathode is operated at a voltage frequency within a range of 0 Hz to about 13.5 MHz.

3. The apparatus of claim 2 wherein said range is about 20 to 100 kHz.

4. The apparatus of claim 2 wherein said hollow cathode is operated at a voltage frequency of about 450 kHz.

5. The apparatus of claim 2 wherein said hollow cathode is operated at a voltage frequency of about 13.5 MHz.

* * * * *